(12) United States Patent
Tominaga et al.

(10) Patent No.: US 9,520,222 B2
(45) Date of Patent: Dec. 13, 2016

(54) WIRING BOARD AND METHOD FOR MANUFACTURING WIRING BOARD

(71) Applicant: IBIDEN CO., LTD., Ogaki-shi (JP)

(72) Inventors: Ryojiro Tominaga, Ogaki (JP); Keinosuke Ino, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 89 days.

(21) Appl. No.: 14/041,638

(22) Filed: Sep. 30, 2013

(65) Prior Publication Data

US 2014/0091892 A1    Apr. 3, 2014

Related U.S. Application Data

(60) Provisional application No. 61/707,133, filed on Sep. 28, 2012.

(51) Int. Cl.

| | |
|---|---|
| *H01F 5/00* | (2006.01) |
| *H01F 27/28* | (2006.01) |
| *H01F 41/00* | (2006.01) |
| *H05K 1/16* | (2006.01) |
| *H05K 1/02* | (2006.01) |
| *H05K 3/46* | (2006.01) |
| *H01F 17/00* | (2006.01) |

(52) U.S. Cl.
CPC ........ *H01F 27/2804* (2013.01); *H01F 41/005* (2013.01); *H05K 1/165* (2013.01); *H01F 2017/002* (2013.01); *H01F 2027/2809* (2013.01); *H05K 1/0216* (2013.01); *H05K 3/4644* (2013.01); *H05K 2201/0191* (2013.01); *H05K 2201/096* (2013.01); *Y10T 156/10* (2015.01)

(58) Field of Classification Search
CPC .................................. H01F 5/00; H01F 27/28
USPC .................................................. 336/200, 232
See application file for complete search history.

(56) References Cited

U.S. PATENT DOCUMENTS

| | | | | |
|---|---|---|---|---|
| 2002/0075116 | A1* | 6/2002 | Peels et al. | 336/200 |
| 2005/0275497 | A1* | 12/2005 | Ramadan et al. | 336/200 |
| 2006/0145805 | A1* | 7/2006 | Kim et al. | 336/200 |
| 2007/0267718 | A1* | 11/2007 | Lee | 257/531 |

(Continued)

FOREIGN PATENT DOCUMENTS

| | | | | |
|---|---|---|---|---|
| JP | 62022416 | A | * | 1/1987 |
| JP | 05183274 | A | * | 7/1993 |
| JP | 2009-016504 | | | 1/2009 |

*Primary Examiner* — Tsz Chan
(74) *Attorney, Agent, or Firm* — Oblon, McClelland, Maier & Neustadt, L.L.P.

(57) ABSTRACT

A wiring board includes a substrate including first insulation layers, a second insulation layer on the first layers, a third insulation layer on the second layer, and a plain conductor on the third layer. The substrate has inductor forming portion in which inductor patterns are formed on the first layers and first via conductors formed in the first layers such that the first via conductors connect the inductor patterns through the first layers, the substrate has a land on the second layer and a second via conductor in the second layer such that the second via conductor connects the land and the outermost inductor pattern, the substrate has a third via conductor in the third layer such that the third via conductor connects the plain conductor and land and has the central axis passing through the center of the third via conductor inside projected region of the second via conductor.

16 Claims, 11 Drawing Sheets

(56) References Cited

U.S. PATENT DOCUMENTS

| | | | |
|---|---|---|---|
| 2009/0078451 A1* | 3/2009 | Niki et al. | 174/250 |
| 2009/0315662 A1* | 12/2009 | Hijioka et al. | 336/200 |
| 2009/0322447 A1* | 12/2009 | Daley et al. | 333/185 |
| 2010/0126758 A1* | 5/2010 | Akai et al. | 174/257 |
| 2012/0188047 A1* | 7/2012 | Groves et al. | 336/200 |
| 2012/0306608 A1* | 12/2012 | Takenaka | H05K 1/165 336/200 |

* cited by examiner

WIRING BOARD AND METHOD FOR MANUFACTURING WIRING BOARD

CROSS-REFERENCE TO RELATED APPLICATIONS

The present application is based upon and claims the benefit of priority from U.S. Application No. 61/707,133, filed Sep. 28, 2012, the entire contents of which are incorporated herein by reference.

BACKGROUND OF THE INVENTION

Field of the Invention

The present invention relates to a wiring board and its manufacturing method.

Description of Background Art

Low-voltage microprocessors with low drive voltage and little power consumption are used for mobile electronic devices such as cell phones and notebook personal computers. By using a low-voltage microprocessor, heat generation in an electronic device is suppressed, and a battery of predetermined capacity can drive the electronic device for a long duration.

Japanese Laid-Open Patent Publication No. 2009-16504 describes a technology for forming an inductor in a wiring board by electrically connecting to each other conductive patterns formed on different insulation layers of the wiring board. The entire contents of this publication are incorporated herein by reference.

SUMMARY OF THE INVENTION

According to one aspect of the present invention, a wiring board includes a substrate including multiple first insulation layers, a second insulation layer formed on the first insulation layers, a third insulation layer formed on the second insulation layer, and a plain conductor formed on the third insulation layer. The substrate has an inductor forming portion in which multiple inductor patterns are formed on the first insulation layers, respectively, and first via conductors formed in the first insulation layers, respectively, such that the first via conductors are connecting the inductor patterns through the first insulation layers, the substrate has a land structure formed on the second insulation layer and a second via conductor formed in the second insulation layer such that the second via conductor is connecting the land structure and the outermost inductor pattern of the inductor patterns, the substrate has a third via conductor formed in the third insulation layer such that the third via conductor is connecting the plain conductor and the land structure and has the central axis passing through the center of the third via conductor inside a projected region of the second via conductor.

According to another aspect of the present invention, a method for manufacturing a wiring board includes forming multiple first insulation layers having multiple inductor patterns, respectively, and multiple first via conductors in the first insulation layers such that the first via conductors are connecting the inductor patterns through the first insulation layers, forming a second insulation layer on the multiple first insulation layers having the inductor patterns, forming a land structure on the second insulation layer, forming a second via conductor in the second insulation layer such that the second via conductor is connecting the land structure and the outermost inductor pattern of the inductor patterns, forming a third insulation layer on the second insulation layer and the land structure, forming a plain conductor on the third insulation layer, and forming a third via conductor in the third insulation layer such that the third via conductor is connecting the plain conductor and the land structure and has the central axis which passes through the center of the third via conductor inside a projected region of the second via conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
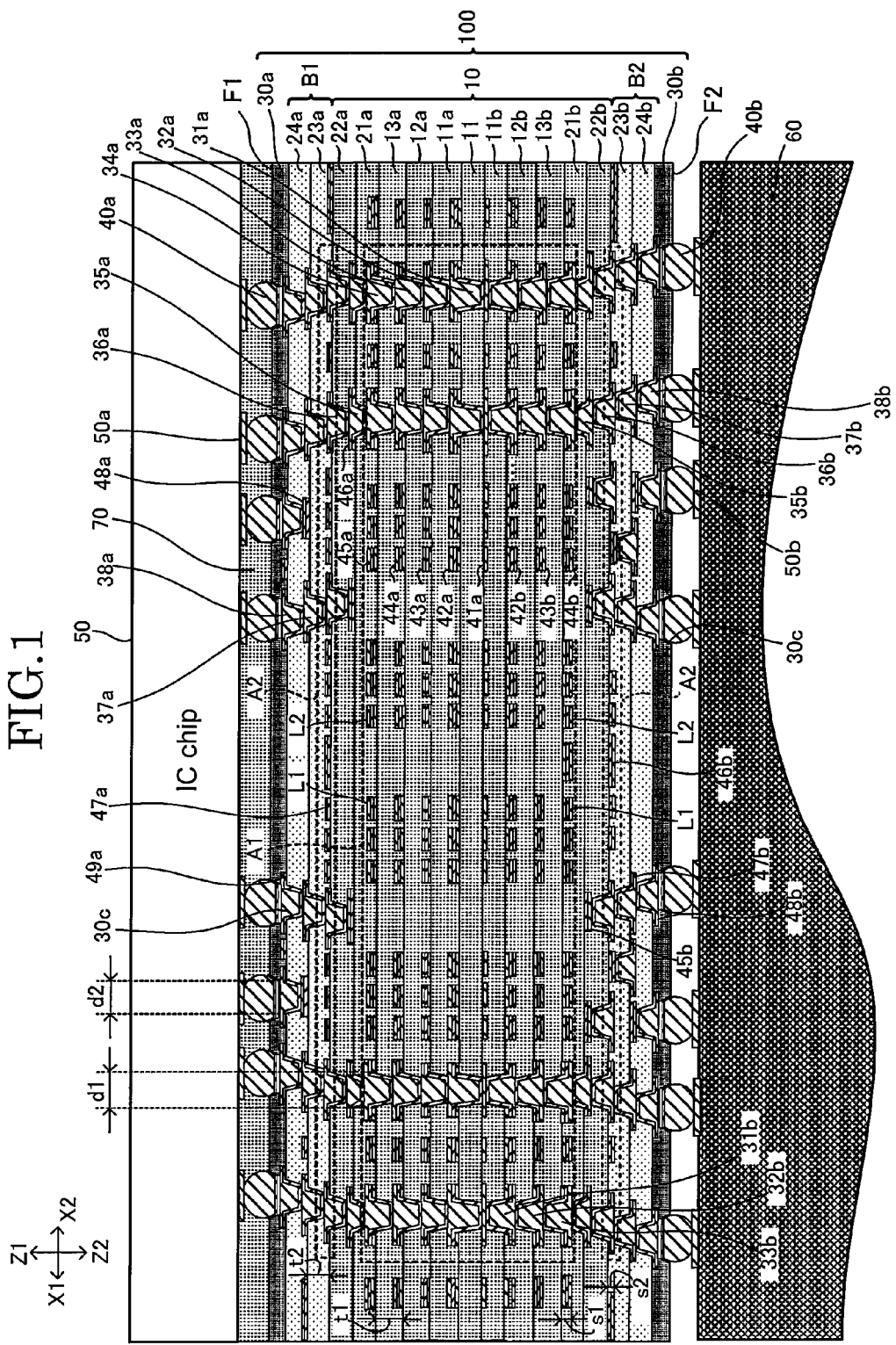
FIG. 1 is a cross-sectional view of a wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction of a substrate (or a thickness direction of the substrate) corresponding to a direction along a normal line to main surfaces of the substrate (upper and lower surfaces). On the other hand, arrows (X1, X2, Y1, Y2) each indicate a direction perpendicular to a lamination direction (or a direction to a side of each layer). Main surfaces of a substrate are on the X-Y plane. Side surfaces of the substrate are on the X-Z plane or Y-Z plane. An end surface of a conductive pattern corresponds to a side surface of the conductive pattern.

In the following embodiment, a conductive layer means a layer that is formed from one or multiple conductive patterns. A conductive layer may include a conductive pattern that forms an electrical circuit such as wiring (including ground), pad, land or the like, or may include a plain conductive pattern that does not form an electrical circuit.

Opening portions include a notch and a slit in addition to a hole and a groove.

Among the conductors formed in opening portions, the conductor formed in a via hole is referred to as a via conductor, the conductor formed in a through hole as a through-hole conductor, and the conductor filled in an opening portion as a filled conductor.

A land portion is a conductor formed on a hole (via hole, through hole or the like) or on the periphery of a hole. At least part of such a land is formed to be integrated with the conductor in the hole (via conductor, through-hole conductor or the like).

Being stacked means a situation where a via conductor is formed on the land of a via conductor in the lower layer. Namely, unless the bottom of a via conductor is formed outside the land of the lower via conductor, they are stacked.

Plating includes dry plating such as PVD (physical vapor deposition), CVD (chemical vapor deposition) and the like in addition to wet plating such as electrolytic plating, electroless plating and the like.

As for the resin material for interlayer material (insulation layers), resin film for interlayer insulation layers (brand name: ABF-45SH, made by Ajinomoto) may be used, for example.

Unless otherwise specified, the "width (or thickness)" of a hole or a column (protruding portion) indicates the diameter if it is a circle, and $2\sqrt{(\text{cross section}/\pi)}$ if it is other than a circle. However, measurements are not limited to the above definitions if they are clearly indicated otherwise. In addition, if the measurements are not constant (situations with irregularity, a tapering shape or the like), the average value of the measurements is basically used (average of effective values excluding abnormal values). However, that is not the only option if it is clearly stated that the maximum value or the like be used rather than the average value.

As shown in FIG. 1, for example, wiring board 100 of the present embodiment is a multilayer printed wiring board, more specifically, a buildup multilayer wiring board with core substrate 10. However, the wiring board of the present embodiment is not limited to a buildup multilayer wiring board with core substrate 10, and it may be, for example, a double-sided rigid wiring board, a flexible wiring board or a flex-rigid wiring board. In addition, measurements of conductive layers and insulation layers, their number of layers or the like in wiring board 100 may be modified freely within a scope of the technological concept of the present invention.

As shown in FIG. 1, IC chip 50 as a first semiconductor element is mounted on wiring board 100 to form a package substrate. As for IC chip 50, for example, a microprocessor MPU (micro-processing unit) and a dynamic RAM, DRAM (Dynamic Random Access Memory) are listed. As shown in FIG. 1, wiring board 100 is mounted on motherboard 60. The portion between wiring board 100 and IC chip 50 is encapsulated with underfill resin 70.

Wiring board 100 has first surface (F1) (the Z1 side) and its opposing second surface (F2) (the Z2 side). Wiring board 100 has core substrate 10 in the center in a thickness direction. Core substrate 10 has the following: multiple first insulation layers (11, 11a, 12a, 13a); second insulation layer (21a); third insulation layer (22a); first insulation layers (11b, 12b, 13b); second insulation layer (21b); third insulation layer (22b); first conductive patterns (41a, 42a, 43a, 44a, 45a) and second conductive patterns (46a, 47a, 42b, 43b, 44b, 45b, 46b), which are formed on first insulation layers (11, 11a, 12a, 13a), second insulation layer (21a), third insulation layer (22a), first insulation layers (11b, 12b, 13b), second insulation layer (21b) and third insulation layer (22b); and first via conductors (31a, 32a, 33a, 34a), second via conductor (35a), third via conductor (36a), first via conductors (31b, 32b, 33b), second via conductor (35b) and third via conductor (36b), which are formed in first insulation layers (11, 11a, 12a, 13a), second insulation layer (21a), third insulation layer (22a), first insulation layers (11b, 12b, 13b), second insulation layer (21b) and third insulation layer (22b), and which connect first conductive patterns (41a, 42a, 43a, 44a, 45a) and second conductive patterns (46a, 47a, 42b, 43b, 44b, 45b, 46b) to each other.

In core substrate 10 of the present embodiment, first conductive patterns (41a, 42a, 43a, 44a, 45a, 42b, 43b, 44b) of inductors (L1, L2) are set to be eight layers. However, the number of layers is not limited specifically as long as desired inductance is achieved.

First insulation layers (11, 11a, 12a, 13a), second insulation layer (21a), third insulation layer (22a), first insulation layers (11b, 12b, 13b), second insulation layer (21b) and third insulation layer (22b) contain inorganic fiber reinforcing material. Such inorganic fiber reinforcing material is not limited specifically, and glass cloth, glass nonwoven fabric, aramid cloth, aramid nonwoven fabric or the like may be used.

Among first insulation layers (11, 11a, 12a, 13a), second insulation layer (21a), third insulation layer (22a), first insulation layer (11b, 12b 13b), second insulation layer (21b) and third insulation layer (22b) of core substrate 10, first conductive pattern (42a) is formed on the first-surface (F1) side surface of first insulation layer 11 positioned in the center in a thickness direction, and first conductive pattern (41a) is formed on its opposing second-surface (F2) side surface (lower surface) of first insulation layer 11. First via conductor (31a) is formed in first insulation layer 11, and first conductive pattern (42a) and first conductive pattern (41a) are connected by first via conductor (31a).

On the first-surface (F1) side surface of first insulation layer 11, first insulation layers (11a, 12a, 13a), second insulation layer (21a) and third insulation layer (22a) are laminated in that order. First conductive patterns (43a, 44a, 45a) and second conductive patterns (46a, 47a) are formed respectively on first insulation layers (11a, 12a, 13a), second insulation layer (21a) and third insulation layer (22a). Then, first conductive pattern (43a) and first conductive pattern (42a) are connected by first via conductor (32a), and first conductive pattern (43a) and first conductive pattern (44a) are connected by first via conductor (33a). Also, first conductive pattern (44a) and first conductive pattern (45a) are connected by first via conductor (34a).

On the second-surface (F2) side surface (lower surface) of first insulation layer 11, first insulation layers (11b, 12b, 13b), second insulation layer (21b) and third insulation layer (22b) are laminated in that order. First conductive patterns (42b, 43b, 44b) and second conductive patterns (45b, 46b) are formed respectively on first insulation layers (11b, 12b, 13b), second insulation layer (21b) and third insulation layer (22b). Then, first conductive pattern (42b) and first conductive pattern (41a) are connected by first via conductor (31b), and first conductive pattern (42b) and first conductive pattern (43b) are connected by first via conductor (32b). Also, first conductive pattern (43b) and first conductive pattern (44b) are connected by first via conductor (33b).

Buildup layers (B1, B2) are formed on the first-surface (F1) side and the second-surface (F2) side of core substrate 10.

Buildup layer (B1) has fourth insulation layers (23a, 24a), second conductive patterns (48a, 49a) on fourth insulation layers (23a, 24a), and fourth via conductors (37a, 38a) formed in fourth insulation layers (23a, 24a) and connecting second conductive pattern (47a) and second conductive patterns (48a, 49a).

Buildup layer (B2) has fourth insulation layers (23b, 24b), second conductive patterns (47b, 48b) on fourth insulation layers (23b, 24b), and fourth via conductors (37b, 38b) formed in fourth insulation layers (23b, 24b) and connecting second conductive pattern (46b) and second conductive patterns (47b, 48b).

Here, fourth insulation layers (23a, 24a, 23b, 24b) do not contain inorganic fiber reinforcing material, and are formed using insulative resin film, for example, interlayer insulation film (brand name: ABF-45SH, made by Ajinomoto).

Second conductive pattern (46a) is formed on second insulation layer (21a). Second conductive pattern (46a) and first conductive pattern (45a) are connected by second via conductor (35a). Third insulation layer (22a) and fourth insulation layers (23a, 24a) are laminated in that order on second insulation layer (21a) and second conductive pattern (46a). Second conductive patterns (46a, 47a, 48a, 49a) are formed respectively on second insulation layer (21a), third insulation layer (22a) and fourth insulation layers (23a, 24a). Then, second conductive patterns (46a, 47a, 48a, 49a) are connected to each other by third via conductor (36a) and fourth via conductors (37a, 38a) formed respectively in third insulation layer (22a) and fourth insulation layers (23a, 24a).

On the other hand, second conductive pattern (45b) is formed on second insulation layer (21b). Second conductive pattern (45b) and first conductive pattern (44b) are connected by second via conductor (35b). Third insulation layer (22b) and fourth insulation layers (23b, 24b) are laminated in that order on second insulation layer (21b) and second conductive pattern (45b). Second conductive patterns (45b, 46b, 47b, 48b) are formed respectively on second insulation layer (21b), third insulation layer (22b) and fourth insulation layers (23b, 24b). Then, second conductive patterns (45b, 46b, 47b, 48b) are connected to each other by third via conductor (36b) and fourth via conductors (37b, 38b) formed respectively in third insulation layer (22b) and fourth insulation layers (23b, 24b).

Solder-resist layer (30a) having opening portion (30c) is formed on outermost interlayer resin insulation layer (24a) on the first-surface (F1) side of buildup layer (B1). Solder bump (40a) for connecting wiring board 100 and IC chip 50 as a semiconductor element is formed in opening portion (30c). Solder-resist layer (30b) having opening portion (30c) is formed on outermost interlayer resin insulation layer (24b) on the second-surface (F2) side. Solder bump (40b) for connecting wiring board 100 and motherboard 60 as an external substrate is formed in opening portion (30c).

Figure 2:
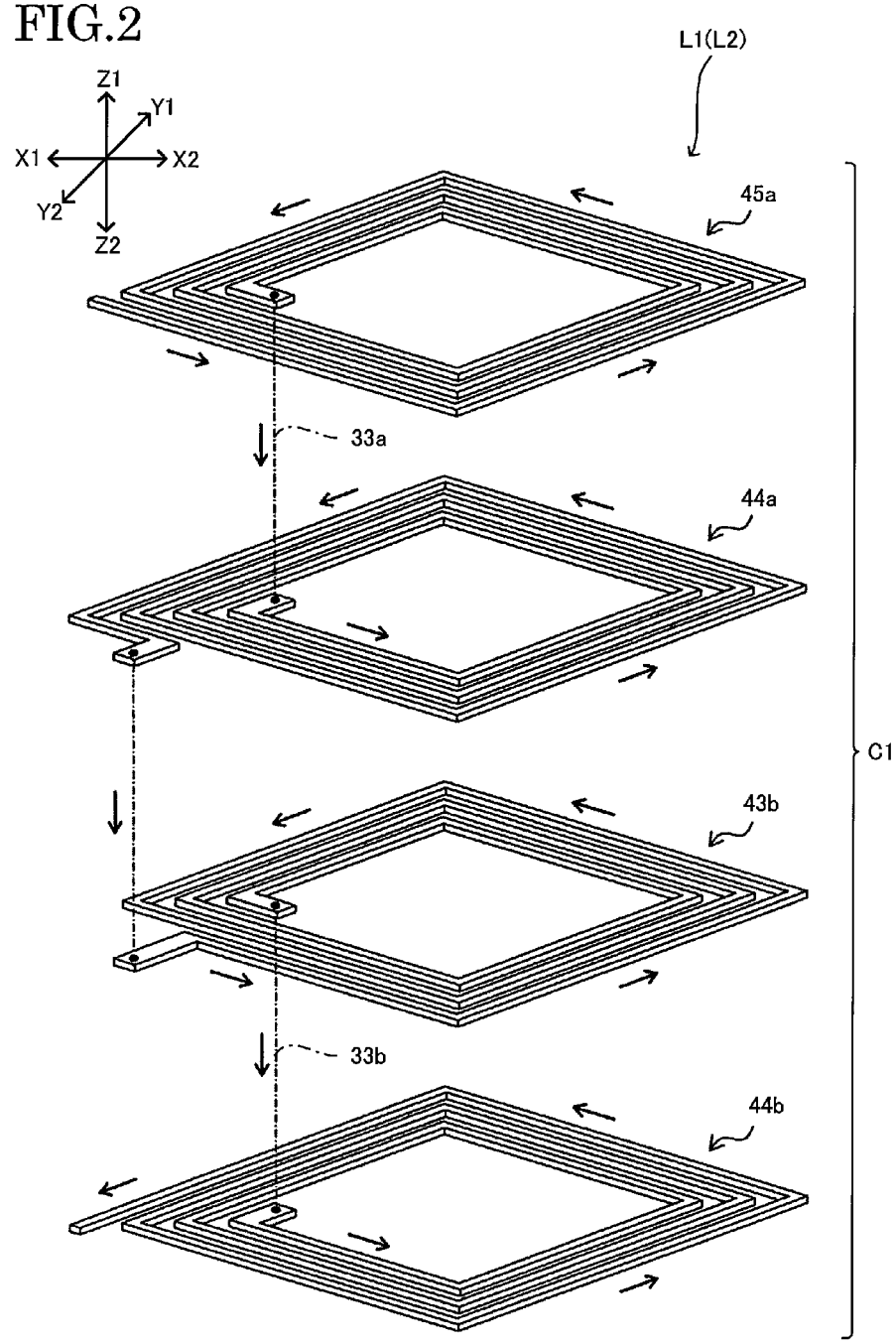
FIG. 2 is a view showing the structure of conductive patterns of an inductor according to the embodiment.

As shown in FIGS. 1 and 2, inductors (L1, L2), which are made of spiral conductive patterns formed on different layers and connected through their respective interlayers, are formed in inductor forming section (A1) in core substrate 10.

As shown in FIG. 2, inductors (L1, L2) each include the following: spiral first conductive patterns (44a, 45a) formed on surfaces of first insulation layers (12a, 13a); first via conductor (33a) connecting first conductive patterns (44a, 45a) to each other; spiral first conductive patterns (43b, 44b) formed on surfaces of first insulation layers (12b, 13b); and first via conductor (33b) connecting first conductive patterns (43b, 44b) to each other.

First conductive patterns (44a, 45a, 43b, 44b) of inductor (L1) are electrically connected with first conductive patterns (44a, 45a, 43b, 44b) of inductor (L2). Inductors (L1, L2) are included in first conductive pattern group (C1).

In FIG. 2, among first conductive pattern group (C1) (inductors (L1, L2)), lowermost first conductive pattern (44b) on the second-surface (F2) side and first conductive pattern (43b) on its upper layer, as well as uppermost first conductive pattern (45a) on the first-surface (F1) side and first conductive pattern (44a) on its lower layer, are shown. In inductor forming section (A1) in core substrate 10, first conductive pattern group (Cn) (n=natural number of 2 or greater) with the same structure as above is included, in addition to first conductive pattern group (C1).

Referring to FIG. 1 again, inductor forming section (A1) in core substrate 10 includes at least a pair of inductors (L1, L2) which are adjacent to each other. Such paired inductors (L1, L2) are electrically connected as described above. Accordingly, voltage converted in the switching section of IC chip 50 is made smooth by inductors (L1, L2) and a capacitor (not shown in the drawings).

As shown in FIG. 1, a pair of upper and lower plain conductors (shielding layers) (A2) including second conductive patterns (47a, 46b) are formed on both surfaces of core substrate 10. Such a pair of upper and lower plain conductors (shielding layers) (A2) are for shielding inductor forming section (A1) in core substrate 10 from external electromagnetic waves.

Upper and lower plain conductors (A2) are respectively connected to power source and ground to work as power-source and ground plain conductors (A2). However, this is not the only option, and both upper and lower plain conductors (A2) may be connected to either power source or ground. Alternatively, upper and lower plain conductors (A2) may be connected respectively to ground and power source.

Figure 3:
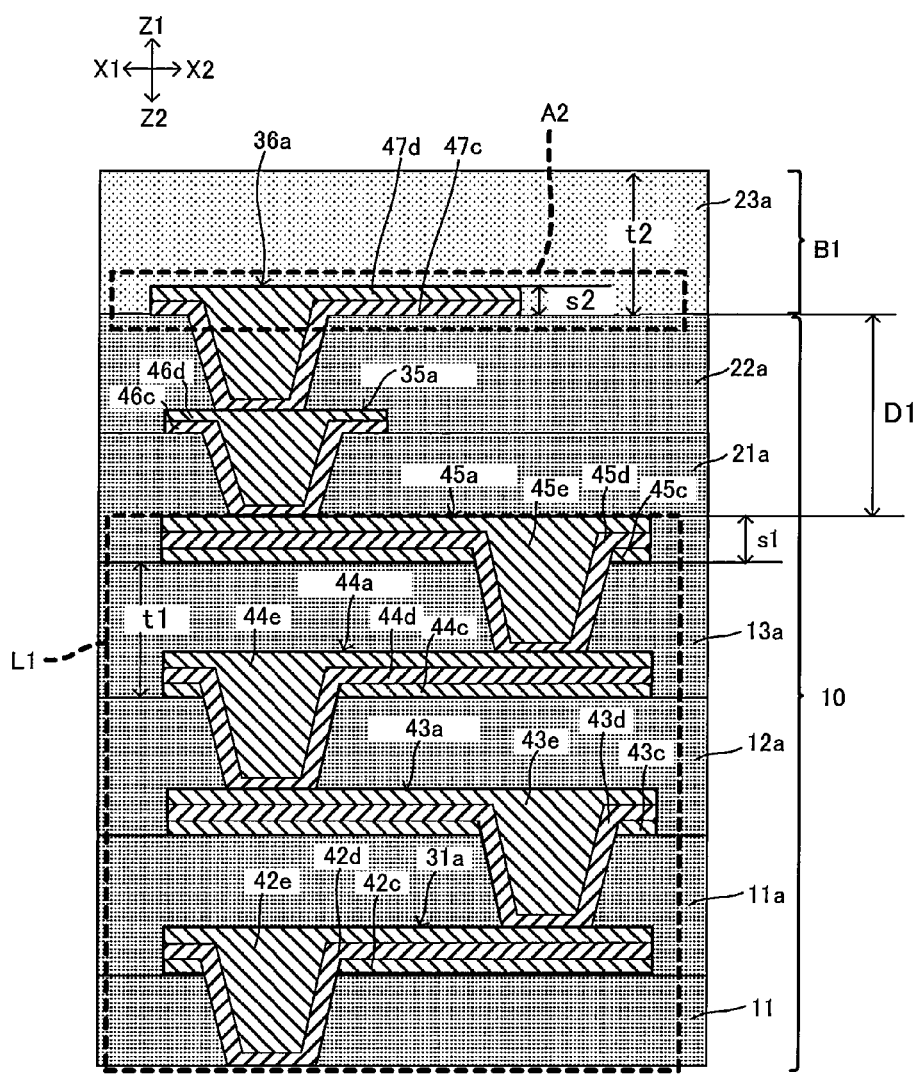
FIG. 3 is a cross-sectional view showing the positional relationship of an inductor and a plain conductor according to the embodiment.

In the present embodiment, second insulation layer (21a), third insulation layer (22a), second insulation layer (21b) and third insulation layer (22b) are positioned between a pair of upper and lower plain conductors (A2) (second conductive patterns (47a, 46b)) and first conductive patterns (45a, 44b) of inductors (L1, L2) as shown in FIGS. 1 and 3. Second via conductor (35a) and third via conductor (36a) are stacked in second insulation layer (21a) and third insulation layer (22a) (see FIG. 3). Second via conductor (35b) and third via conductor (36b) are stacked in second insulation layer (21b) and third insulation layer (22b). Then, as shown in FIG. 3, second via conductor (35a) and third via conductor (36a) form stacked vias (second via conductor (35b) and third via conductor (36b), though not shown in FIG. 3, are set in the same manner). Because of such a structure, inductors (L1, L2) and a pair of upper and lower plain conductors (A2) positioned on the first main surface (F1) and second main surface (F2) of core substrate 10 are separated from each other in a thickness direction of wiring board 100. Accordingly, magnetic flux (magnetic lines of force) generated in inductors (L1, L2) is not interfered with by plain conductors (A2), and the impact from eddy currents generated in plain conductors (A2) is reduced. Desired inductor characteristics (inductance, Q factor) are achieved in inductors (L1, L2).

Here, referring to FIGS. 2 and 3, distance (D1) (μm) between plain conductor (A2) on the buildup layer (B1) side (second conductive pattern (47a)) and uppermost first conductive pattern (45a) of inductors (L1, L2) is preferred to be 100 μm or greater. Such a relationship is the same between plain conductor (A2) on the buildup layer (B2) side (second conductive pattern (46b)) and lowermost first conductive pattern (44b) of inductors (L1, L2). By setting so, magnetic flux (magnetic lines of force) generated in the inductors is prevented even more securely from being interfered with. Accordingly, desired inductor characteristics (inductance, Q factor) are achieved in inductors (L1, L2). In addition, the sum of the thicknesses of second insulation layer (21a) and third insulation layer (22a) is greater than each thickness of first insulation layers (11, 11a, 12a, 13a, 11b, 12b, 13b) (the respective distance between first conductive patterns (41a, 42a, 43a, 44a, 45a, 42b, 43b, 44b) in inductors (L1, L2)). Such a structure also contributes to prevent magnetic flux (magnetic lines of force) generated in inductors (L1, L2) from being interfered with. Accordingly, desired inductor characteristics (inductance, Q factor) tend to be achieved in inductors (L1, L2).

Figure 4A:
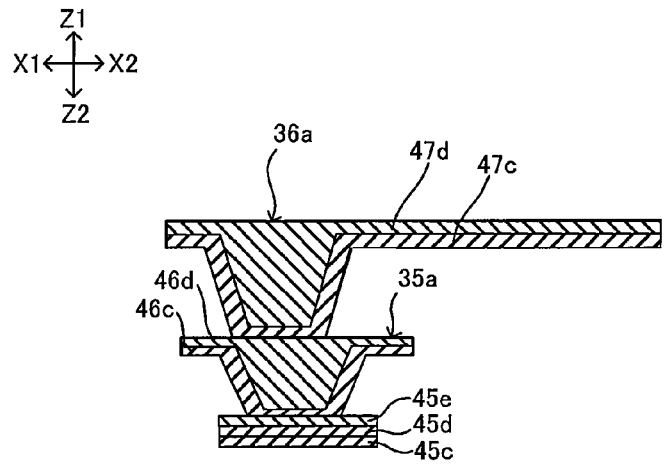
FIG. 4A is a cross-sectional view showing the positional relationship of an inductor and a plain conductor according to the embodiment.
Figure 4B:
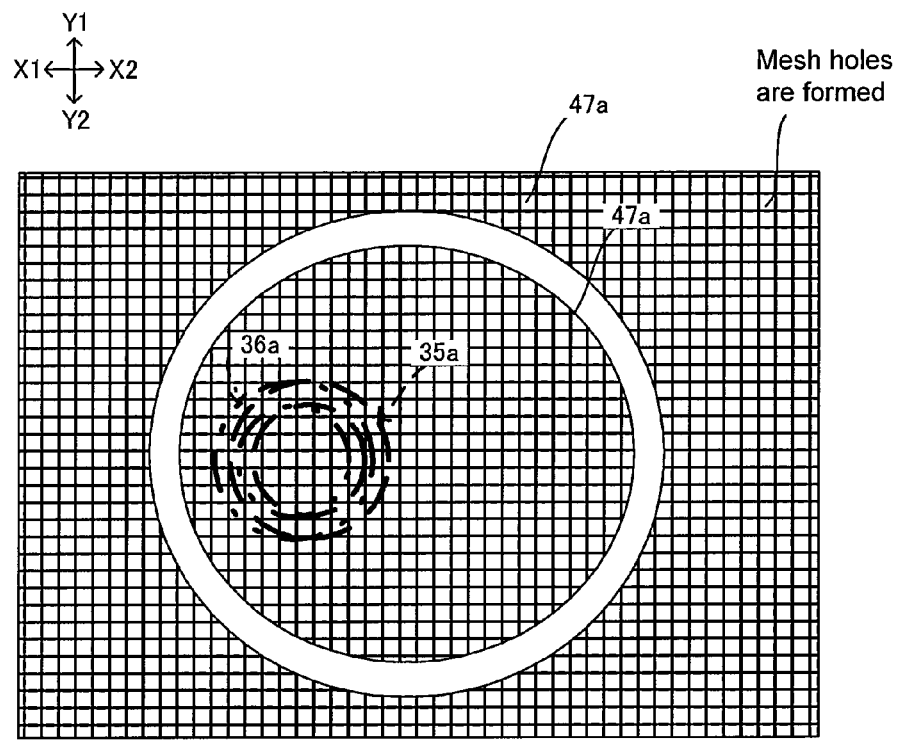
FIG. 4B is a plan view showing the positional relationship of an inductor and a plain conductor according to the embodiment.

Also, mesh holes may be formed in plain conductors (A2) (second conductive patterns (47a, 46b)) (see FIG. 4B). In setting so, passing portions of magnetic flux generated in inductors (L1, L2) are secured in plain conductors (A2), making it easier to achieve desired inductor characteristics (inductance, Q factor) in inductors (L1, L2).

As shown in FIG. 1, first via conductors (31a, 32a, 33a, 34a, 31b, 32b, 33b) positioned around inductors (L1, L2) are laminated along a straight line in a thickness direction of core substrate 10 while fanning out toward the outside. Here, "being laminated along a straight line" means at least portions of those in first via conductors (31a, 32a, 33a, 34a, 31b, 32b, 33b), which are vertically adjacent to each other in a thickness direction, are positioned to overlap in a planar direction. If first via conductors (31a, 32a, 33a, 34a, 31b, 32b, 33b) work as power-source lines, such power-source lines are shortened, and loss of voltage supplied to IC chip 50 (see FIG. 1) is notably suppressed.

Referring to FIG. 1, inductors (L1, L2) are formed directly under the region where IC chip 50 is mounted (the region where solder bumps (40a) are formed) in the present embodiment. In such a case, it is easier to supply voltage to IC chip 50 without loss.

In the present embodiment, inorganic fiber reinforcing material is contained in first insulation layers (11, 11a, 12a, 13a), second insulation layer (21a), third insulation layer (22a), first insulation layers (11b, 12b, 13b), second insulation layer (21b) and third insulation layer (22b), which are vertically sandwiched by first conductive patterns (45a, 44a, 43a, 42a, 41a, 42b, 43b, 44b) of inductors (L1, L2). Accordingly, because of highly rigid inorganic fiber reinforcing material, thermal contraction is suppressed in first insulation layers (11, 11a, 12a, 13a), second insulation layer (21a), third insulation layer (22a), first insulation layers (11b, 12b, 13b), second insulation layer (21b) and third insulation layer (22b). As a result, even if thermal history is added to wiring board 100 during the manufacturing process or reliability testing, for example, warping of wiring board 100 is suppressed.

In the present embodiment, inductors (L1, L2) are each formed in regions of core substrate 10, which are vertically symmetrical at first insulation layer 11 as the center of symmetry. If inductors (L1, L2) are formed only in one region of core substrate 10 with first insulation layer 11 as the center, the difference increases between the volume of the conductors positioned in the upper layers and closer to buildup layer (B1) and the volume of conductors positioned in the lower layers and closer to buildup layer (B2). In such a case, when thermal history is added to wiring board 100, the amounts of thermal contraction differ, and warping of wiring board 100 tends to occur. By contrast, in the structure of wiring board 100 according to the present embodiment, inductors (L1, L2) are formed in regions which are vertically symmetrical at first insulation layer 11 as the center of symmetry. Thus, mass symmetry is secured in regions that are positioned vertically symmetrical and include buildup layers (B1, B2), and warping is suppressed.

In the present embodiment, electrical connection between first main surface (F1) and second main surface (F2) of core substrate 10 is secured by via conductors formed in multiple first insulation layers (11, 11a, 12a, 13a), second insulation layer (21a), third insulation layer (22a) and first insulation layers (11b, 12b, 13b). Thus, the depth of a via conductor in proportion to its opening portion (aspect ratio) is smaller than that of a penetrating hole which penetrates through core substrate 10 with the same thickness. Accordingly, even with a smaller diameter of each via conductor, the plating solution for filling via conductors with plating flows well. As a result, it is less likely for voids to remain in spiral conductive patterns of inductors (L1, L2) and in via conductors, the reliability of each via conductor is improved, and the electrical connection between the upper and lower surfaces of the core substrate becomes excellent. As described above, the performance of inductors (L1, L2) (especially, Q factor) is enhanced by suppressing voids in inductors (L1, L2).

As shown in FIGS. 1 and 3, diameter (d1) (m) of first via conductors (31a, 32a, 33a, 34a, 31b, 32b, 33b) of core substrate 10 is set greater than diameter (d2) (μm) of second via conductor (35a), third via conductor (36a), fourth via conductors (37a, 38a), second via conductor (35b), third via conductor (36b) and fourth via conductors (37b, 38b) in the present embodiment. For example, diameter (d1) is 80 μm for first via conductors (31a, 32a, 33a, 34a, 31b, 32b, 33b) of core substrate 10, while diameter (d2) is 50 μm for second via conductor (35a), third via conductor (36a), fourth via conductors (37a, 38a), second via conductor (35b), third via conductor (36b) and fourth via conductors (37b, 38b). As described, by setting the diameter to be relatively large for first via conductors (31a, 32a, 33a, 34a, 31b, 32b, 33b) which function as inductors (L1, L2) in core substrate 10, the performance of the inductors (especially, Q factor) is further enhanced.

In the present embodiment, thickness (s1) (μm) of first conductive patterns (41a, 42a, 43a, 44a, 45a, 42b, 43b, 44b) which form inductors (L1, L2) is set greater than thickness (s2) (μm) of second conductive patterns (46a, 47a, 48a, 49a, 45b, 46b, 47b 48b). For example, thickness (s1) (μm) is 20~40 μm for first conductive patterns (41a, 42a, 43a, 44a, 45a, 42b, 43b, 44b) of core substrate 10, while thickness (s2) (μm) is 10~18 μm for second conductive patterns (46a, 47a, 48a, 49a, 45b, 46b, 47b 48b). As described, by setting the thickness to be relatively large for first conductive patterns (41a, 42a, 43a, 44a, 45a, 42b, 43b, 44b) of inductors (L1, L2), loss is reduced and the inductance is stabilized, enhancing the performance of inductors (L1, L2). Moreover, rigidity is added to core substrate 10 to improve its strength. In addition, by setting the thickness of second conductive patterns (46a, 47a, 48a, 49a, 45b, 46b, 47b, 48b) to be relatively thin, second conductive patterns (46a, 47a, 48a, 49a, 45b, 46b, 47b, 48b) may be set at a fine pitch. Accordingly, wiring board 100 is formed to be multilayered while its entire thickness is reduced. Furthermore, since the thickness of second conductive patterns (46a, 47a, 48a, 49a, 45b, 46b, 47b, 48b) is relatively thin, when second insulation layers (21a, 22a, 23a, 24a, 21b, 22b, 23b, 24b) are formed to cover the second conductive patterns, voids are suppressed in those second insulation layers.

In the present embodiment, first conductive pattern (42a) of inductors (L1, L2), for example, is made of copper foil (42c), electroless plated film (42d) and electrolytic plated film (42e) which are formed on first insulation layer 11. Since first conductive patterns (41a, 42a, 43a, 44a, 45a, 42b, 43b, 44b) are formed as above, they are formed to have an appropriate thickness to secure the performance of inductors (especially, Q factor).

In the present embodiment, thickness (t1) (μm) of first insulation layers (11, 11a, 12a, 13a), second insulation layer (21a), third insulation layer (22a), first insulation layers (11b, 12b, 13b), second insulation layer (21b) and third insulation layer (22b) of core substrate 10 is set greater than thickness (t2) (μm) of fourth insulation layers (23a, 24a, 23b, 24b) of buildup layers (B1, B2). For example, the thickness is approximately 60 μm for first insulation layers (11, 11a, 12a, 13a), second insulation layer (21a), third insulation layer (22a), first insulation layers (11b, 12b, 13b), second insulation layer (21b) and third insulation layer (22b), while the thickness is approximately 40 μm for fourth insulation layers (23a, 24a, 23b, 24b). As described, by setting the thickness to be relatively thick for multiple first insulation layers (11, 11a, 12a, 13a), second insulation layer (21a), third insulation layer (22a), first insulation layers (11b, 12b, 13b), second insulation layer (21b) and third insulation layer (22b) of core substrate 10, the rigidity of core substrate 10 is secured. Moreover, the depth is made relatively deep for first via conductors (31a, 32a, 33a, 34a, 31b, 32b, 33b) of inductors (L1, L2), making desired inductance easier to achieve in inductors (L1, L2). In addition, by setting the thickness of fourth insulation layers (23a, 24a, 23b, 24b) to be relatively thin, second conductive patterns (48a, 49a, 47b, 48b) are made fine pitched on the buildup layer (B1) side and buildup layer (B2) side. Accordingly, wiring board 100 is formed to be multilayered while its entire thickness is reduced.

In the present embodiment, among the first via conductors of core substrate 10, first via conductors (31a, 32a, 33a, 34a, 31b, 32b, 33b) which do not form inductors (L1, L2) are laminated along a straight line in a thickness direction. Therefore, power lines or signal lines may be set at a minimum length. Also, by laminating first via conductors (31a, 32a, 33a, 34a, 31b, 32b, 33b) as above, the rigidity of core substrate 10 is also secured.

In the present embodiment, second via conductor (35a), third via conductor (36a) and fourth via conductors (37a, 38a), which connect uppermost first conductive pattern (45a) in inductors (L1, L2) and uppermost second conductive pattern (49a) of buildup layer (B1), are laminated along a straight line. "Being laminated along a straight line" means at least portions of second via conductor (35a), third via conductor (36a) and fourth via conductors (37a, 38a), which are vertically adjacent to each other in a thickness direction, are positioned to overlap in a planar direction. Here, plain conductor (A2) for power source or ground is formed on third insulation layer (22a) of core substrate 10.

Figure 4C:
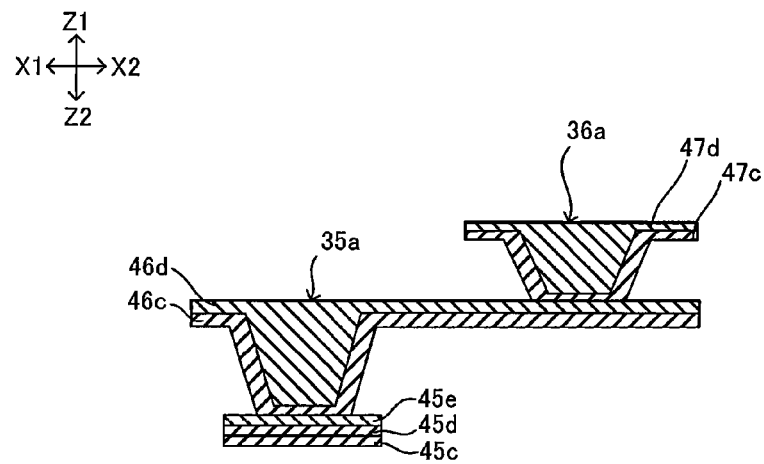
FIG. 4C is a cross-sectional view showing the positional relationship of an inductor and a plain conductor according to a reference example.
Figure 4D:
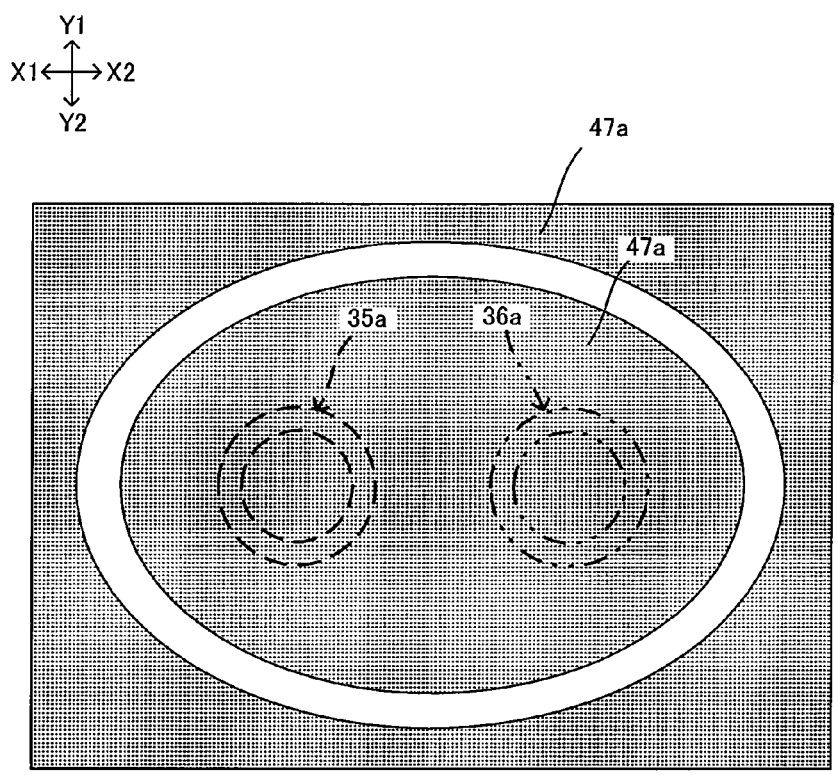
FIG. 4D is a plan view showing the positional relationship of an inductor and a plain conductor according to the reference example.

If second via conductor (35a) and third via conductor (36a) positioned vertically are offset in a planar direction as shown in FIGS. 4C and 4D, the land portion (second conductive pattern (47a) in an elliptical shape) has a relatively large area. Accordingly, inductance of inductors (L1, L2) may be interfered with by such a land portion with a large area, and inductance of inductors (L1, L2) may be reduced. By contrast, when multiple via conductors in buildup layer (B1) (second via conductor (35a), third via conductor (36a), for example) are laminated along a straight line as shown in FIGS. 4A and 4B, the central axis that passes through the center of third via conductor (36a) is positioned within the projected region of second via conductor (35a). In such a case, the land portion (second conductive pattern (47a) in an elliptical shape) has a relatively small area, and inductance of inductors (L1, L2) is not interfered with by such a land portion with a small area. As a result, desired inductance is achieved in inductors (L1, L2).

Here, "land portion" means part of a conductive pattern which is in the shape of a circle or ellipse, is directly connected to second via conductor (35a), third via conductor (36a) or the like, and is insulated from the surrounding conductive pattern (see FIGS. 4A~4D).

In the present embodiment, except for second via conductor (35a), third via conductor (36a) and the land portion (second conductive pattern (46a) in an elliptical shape), there is no conductor existing between plain conductor (A2) and first conductive pattern (45a) positioned on the outermost layer in inductor forming section (A1). Such a structure contributes to a reduction in impact from eddy currents generated in the land portion, making it easier to achieve desired inductor characteristics (inductance, Q factor) in inductors (L1, L2).

Manufacturing Process of Wiring Board

The following is an example of a method for manufacturing wiring board 100 according to the present embodiment. A method for manufacturing wiring board 100 of the present embodiment is not limited to the following, and any other manufacturing method may be employed.

Figure 5:
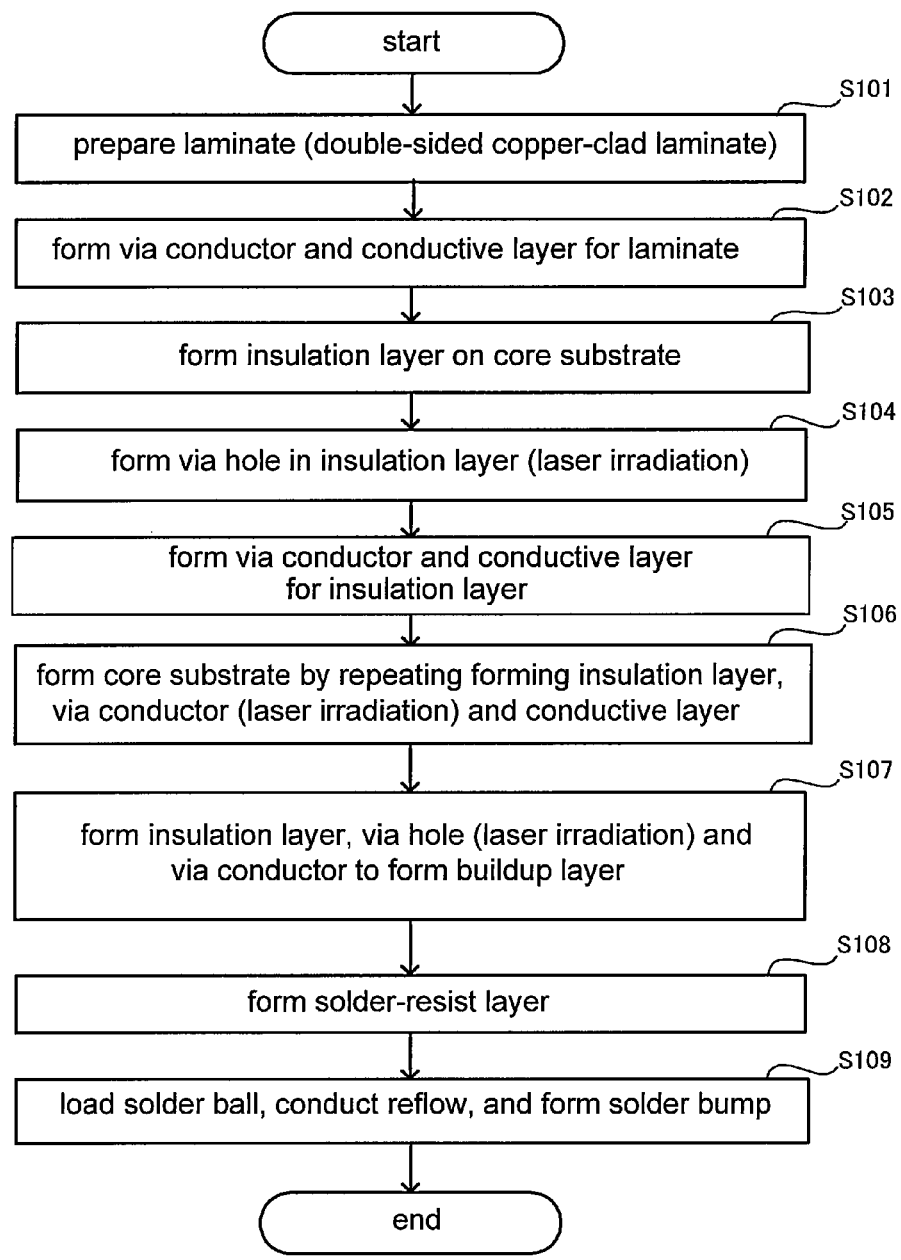
FIG. 5 is a flowchart showing the method for manufacturing a wiring board according to the embodiment of the present invention.
Figure 6A:
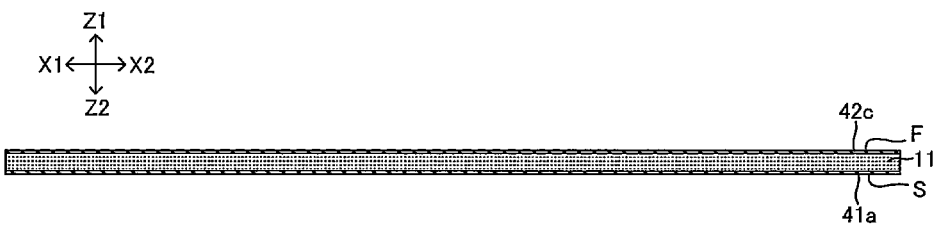
FIG. 6A is a cross-sectional view illustrating the method for manufacturing a wiring board according to the embodiment of the present invention.

First, in step (S101) of FIG. 5, a double-sided copper-clad laminate (CCL-HL832NSLC) is prepared as shown in FIG. 6A. Such a laminate is formed by laminating copper foils (41a, 42c) on both surfaces of insulation layer 11, which is prepreg made by impregnating glass-cloth core material with epoxy resin.

Figure 6B:
FIG. 6B is a cross-sectional view illustrating the method for manufacturing a wiring board according to the embodiment.
Figure 6C:
FIG. 6C is a cross-sectional view illustrating the method for manufacturing a wiring board according to the embodiment.
Figure 6D:
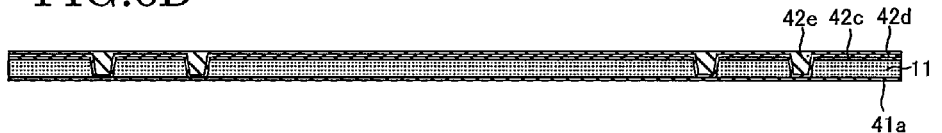
FIG. 6D is a cross-sectional view illustrating the method for manufacturing a wiring board according to the embodiment.
Figure 6E:
FIG. 6E is a cross-sectional view illustrating the method for manufacturing a wiring board according to the embodiment.

In step (S102) of FIG. 5, a laser is used to form opening portions (11c), which penetrate through copper foil (42c) and insulation layer 11 (first insulation layer 11) as shown in FIG. 6B. Next, conductive patterns are formed on both surfaces of insulation layer 11 using a subtractive method. Specifically, electroless plated film (42d) is formed as shown in FIGS. 6C and 6D. Then, electrolytic plating is performed to form electrolytic plated film (42e) on surfaces of insulation layer 11 and in opening portions (11c). Next, as shown in FIG. 6E, an etching resist with a predetermined pattern (not shown in the drawings) is formed on electrolytic plated film (42e). Then, electrolytic plated film (42e), electroless plated film (42d) and copper foil (42c) are removed from portions where the etching resist is not formed. Furthermore, the etching resist is removed, forming first via conductors (31a) made of electroless plated film (42d) and electrolytic plated film (42e), first conductive pattern (42a) made of electroless plated film (42d), electrolytic plated film (42e) and copper foil (42c), and first conductive pattern (41a) made of copper foil (41a).

Figure 6F:
FIG. 6F is a cross-sectional view illustrating the method for manufacturing a wiring board according to the embodiment.

Next, in step (S103) of FIG. 5, insulation layer (11a) (first insulation layer (11a)), which is formed with prepreg made by impregnating glass-cloth core material with epoxy resin and with copper foil (43c) formed thereon, is laminated on the upper surface of insulation layer 11, while insulation layer (11b) (first insulation layer (11b)), which is formed with prepreg made by impregnating glass-cloth core material with epoxy resin and with copper foil (43f) formed thereon, is laminated on the lower surface of insulation layer 11, as shown in FIG. 6F.

Figure 6G:
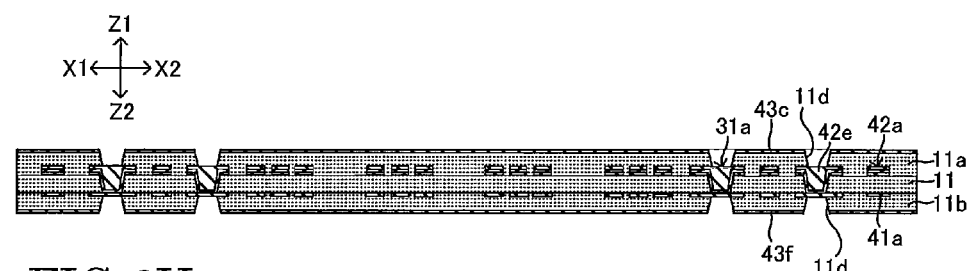
FIG. 6G is a cross-sectional view illustrating the method for manufacturing a wiring board according to the embodiment.

Next, in step (S104) of FIG. 5, after copper foils (43c, 43f) are etched to reduce their thicknesses, a laser is used so that via opening portions (11d) reaching via conductors (31a) are formed on the insulation layer (11a) side, and via opening portions (11d) reaching first conductive pattern (41a) are formed on the insulation layer (11b) side, as shown in FIG. 6G.

Figure 6H:
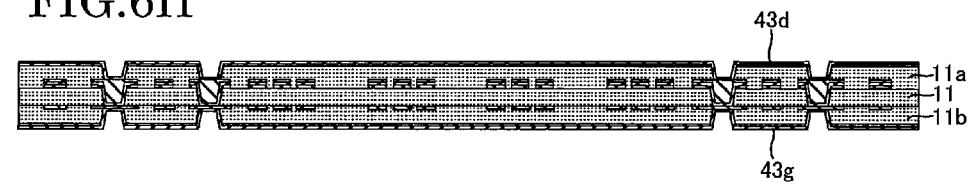
FIG. 6H is a cross-sectional view illustrating the method for manufacturing a wiring board according to the embodiment.

Next, in step (S105) of FIG. 5, electroless plated films (43d, 43g) are formed on surfaces of the laminate, as shown in FIG. 6H. Then, electrolytic plating is further performed to form electrolytic plated films (43e, 43h) on surfaces of insulation layers (11a, 11b) and inside opening portions (11d).

Figure 6I:
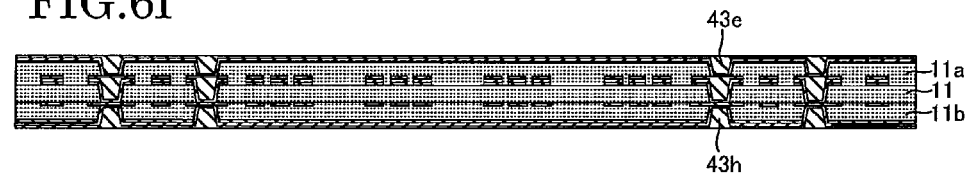
FIG. 6I is a cross-sectional view illustrating the method for manufacturing a wiring board according to the embodiment.

Next, referring to FIG. 6I, etching resist with a predetermined pattern (not shown in the drawings) is formed on electrolytic plated films (43e, 43h). Then, electrolytic plated films (43e, 43h), electroless plated films (43d, 43g) and copper foils (43c, 43f) are removed from portions where the etching resist is not formed.

Figure 6J:
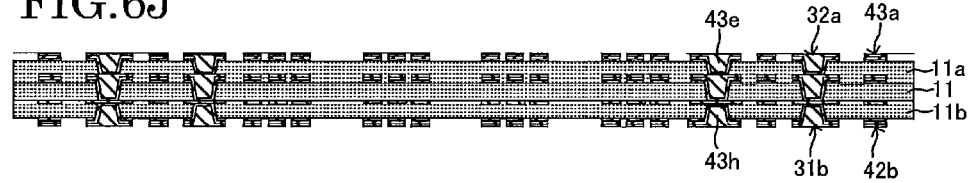
FIG. 6J is a cross-sectional view illustrating the method for manufacturing a wiring board according to the embodiment.

Accordingly, as shown in FIG. 6J, the etching resist is removed, and via conductors (32a) made of electroless plated film (43d) and electrolytic plated film (43e), and first conductive pattern (43a) made of electroless plated film (43d), electrolytic plated film (43e) and copper foil (43f) are formed for the laminate. In addition, via conductors (31b) made of electroless plated film (43g) and electrolytic plated film (43h), and first conductive pattern (42b) made of electroless plated film (43g), electrolytic plated film (43h) and copper foil (43f) are formed for the laminate.

Figure 6K:
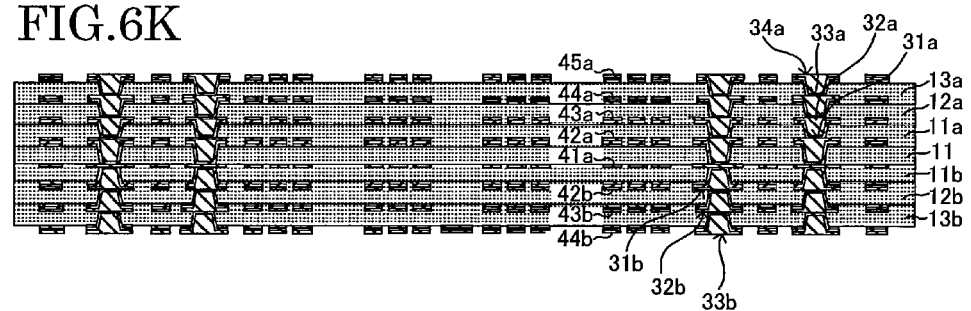
FIG. 6K is a cross-sectional view illustrating the method for manufacturing a wiring board according to the embodiment.

Next, in step (S106) of FIG. 5, the above-described treatments are repeated on the laminate to form insulation layer (12a) having via conductors (33a) and first conductive pattern (44a) as well as insulation layer (12b) having via conductors (32b) and first conductive pattern (43b), as shown in FIG. 6K. Moreover, insulation layer (13a) having via conductors (34a) and first conductive pattern (45a) as well as insulation layer (13b) having via conductors (33b) and first conductive pattern (44b) are laminated.

Figure 6L:
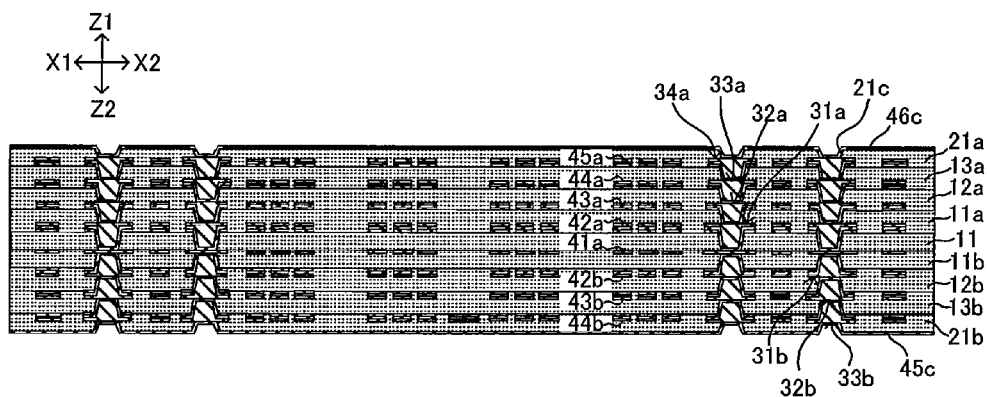
FIG. 6L is a cross-sectional view illustrating the method for manufacturing a wiring board according to the embodiment.
Figure 6M:
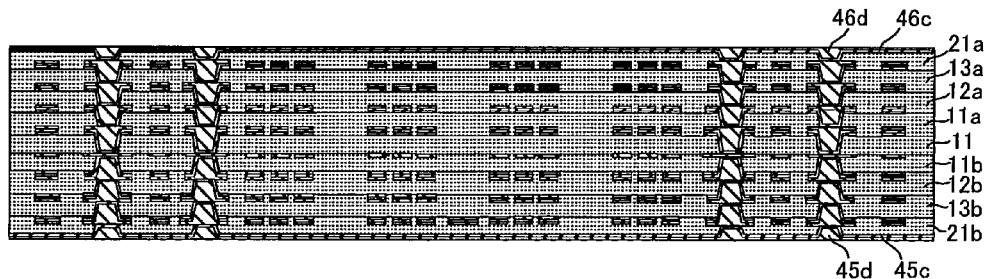
FIG. 6M is a cross-sectional view illustrating the method for manufacturing a wiring board according to the embodiment.

Then, referring to FIGS. 6L and 6M, prepreg made by impregnating glass-cloth core material with epoxy resin is laminated on the first-surface (F1) side and on the second-surface (F2) side of the laminate. Then, the prepreg is thermally cured to form second insulation layers (21a, 21b) on both surfaces of the laminate respectively.

Next, using a $CO_2$ gas laser, opening portions (21c) reaching first conductive pattern (45a) and via conductors (34a) are formed in second insulation layer (21a), and opening portions (21c) reaching first conductive pattern (44b) and via conductors (33b) are formed in second insulation layer (21b). Moreover, the laminate is immersed in an oxidation agent of chromic acid, permanganate or the like to roughen surfaces of second insulation layers (21a, 21b).

Next, a catalyst such as palladium is attached on surface layers of second insulation layers (21a, 21b), and the laminate is immersed in an electroless plating solution for 5~60 minutes. Accordingly, electroless plated films (46c, 45c) are formed with a thickness of 0.1~5 µm.

Figure 6N:
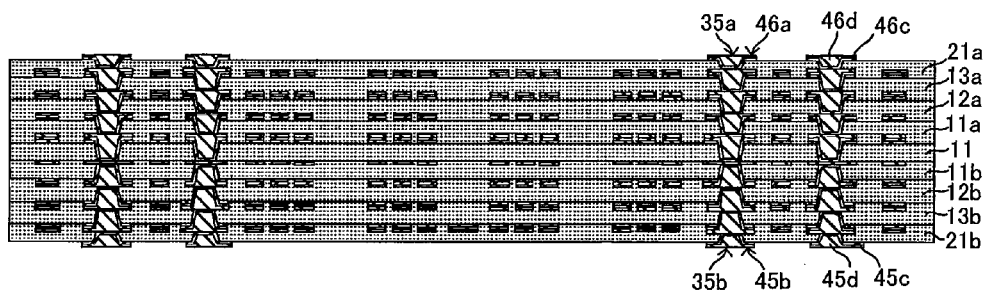
FIG. 6N is a cross-sectional view illustrating the method for manufacturing a wiring board according to the embodiment.

Next, referring to FIG. 6N, a commercially available photosensitive dry film is attached on the laminate after the above treatments, and then exposed to light with a photomask film placed thereon, and developed using sodium carbonate. Accordingly, a plating resist with a thickness of 15 µm (not shown in the drawings) is formed. Then, electrolytic plating is performed, and electrolytic plated films (46d, 45d) with a thickness of 15 µm are formed.

Next, the plating resist is removed using a 5% NaOH solution, and electroless plated films (46c, 45c) under the plating resist are dissolved and removed through etching using a mixed solution of nitric acid, sulfuric acid and hydrogen peroxide.

Accordingly, as shown in FIG. 6N, second conductive patterns (46a, 45b) and second via conductors (35a, 35b), which are made of electroless plated films (46c, 45c) and electrolytic plated films (46d, 45d), are formed to have an approximate thickness of 15 µm. Then, using an etching solution containing copper (II) complex and organic acid, surfaces of second conductive patterns (46a, 45b) and second via conductors (35a, 35b) are roughened.

Figure 6P:
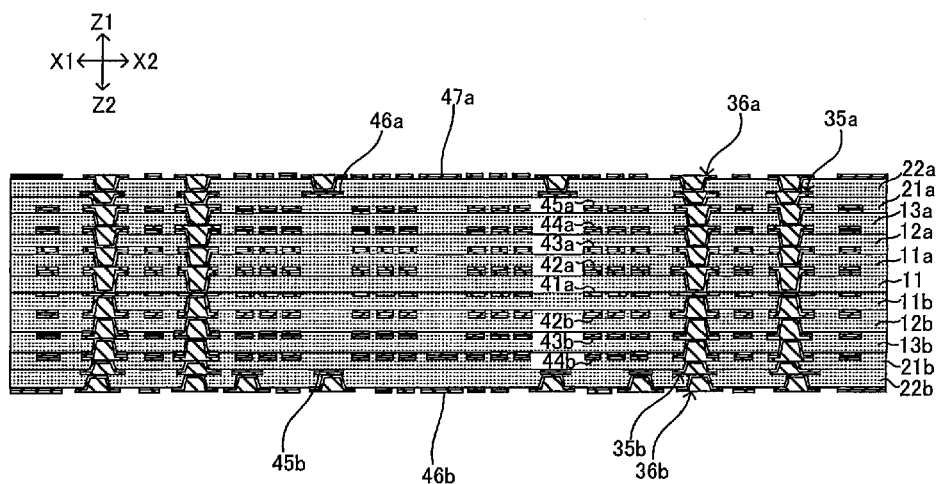
FIG. 6P is a cross-sectional view illustrating the method for manufacturing a wiring board according to the embodiment.

The above treatments are further repeated for third insulation layers (22a, 22b) laminated on second insulation layers (21a, 21b). Accordingly, core substrate 10 of the present embodiment is completed as shown in FIG. 6P.

Figure 6Q:
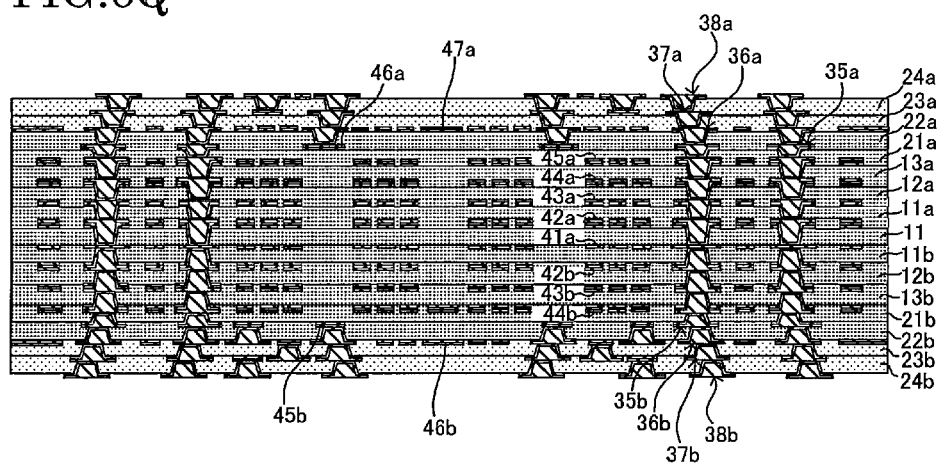
FIG. 6Q is a cross-sectional view illustrating the method for manufacturing a wiring board according to the embodiment.

Next, in step (S107) of FIG. 5, buildup layer (B1) is formed on the first-surface (F1) side of core substrate 10, and buildup layer (B2) is formed on the second-surface (F2) side, as shown in FIG. 6Q (see FIG. 1).

Namely, resin film for interlayer insulation layers (brand name: ABF-45SH, made by Ajinomoto), which does not contain inorganic fiber reinforcing material (such as glass-cloth core material), is laminated on surfaces of the first-surface (F1) side and the second-surface (F2) side of core substrate 10. Then, the film is thermally cured, and interlayer resin insulation layers (23a, 23b) (fourth insulation layers (23a, 23b)) are formed on both surfaces of core substrate 10. By repeating such treatments, interlayer resin insulation layers (24a, 24b) (fourth insulation layers (24a, 24b)) are formed on interlayer resin insulation layers (23a, 23b).

Figure 6R:
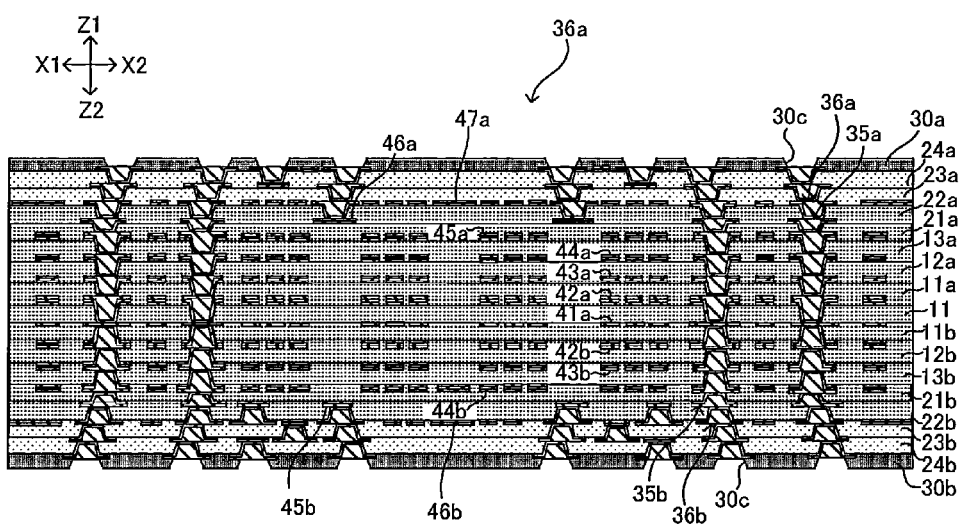
FIG. 6R is a cross-sectional view illustrating the method for manufacturing a wiring board according to the embodiment.

Next, in step (S108) of FIG. 5, a commercially available solder-resist composition is applied on surfaces of buildup layers (B1, B2), which are then exposed and developed so that solder-resist layers (30a, 30b) having opening portions (30c) are formed, as shown in FIG. 6R.

Next, the laminate obtained through the above procedures is immersed in an electroless nickel plating solution so that a nickel-plated layer is formed in opening portions (30c) (not shown in the drawings). The laminate is further immersed in an electroless gold plating solution to form a gold-plated layer (not shown in the drawings) on the nickel-plated layer. Here, nickel-palladium-gold layers may also be formed instead of nickel-gold layers.

Figure 6S:
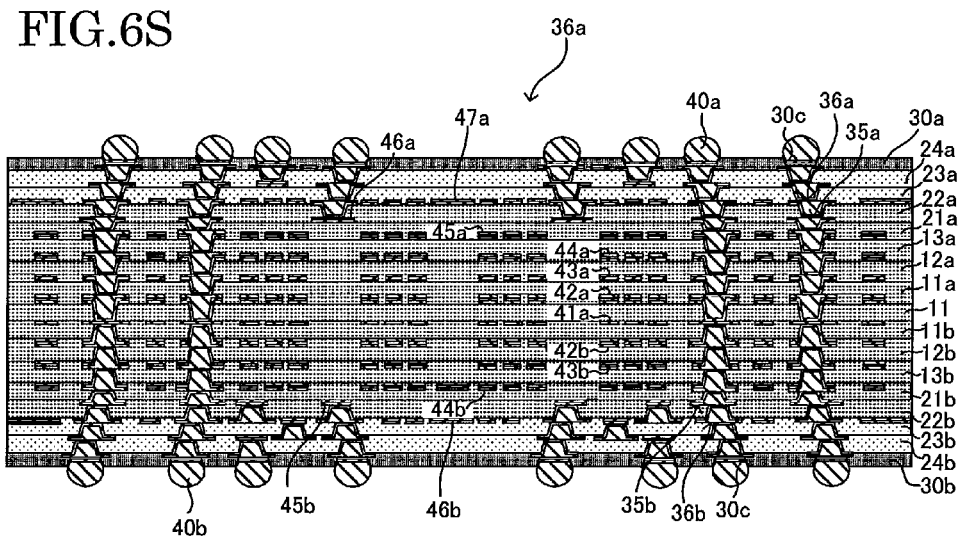
FIG. 6S is a cross-sectional view illustrating the method for manufacturing a wiring board according to the embodiment.

Next, in step (S109) of FIG. 5, solder balls are loaded in opening portions (30c) as shown in FIG. 6S, and a reflow process is conducted. Accordingly, solder bumps (40a) are formed on the first main-surface (F1) side, and solder bumps (40b) are formed on the second main-surface (F2) side. Wiring board 100 (see FIG. 1) is completed after the above process.

A manufacturing process of a wiring board according to the present invention is not limited to the order and contents shown in the above embodiment and modified examples. The order and contents may be modified freely within a scope that does not deviate from the gist of the present invention. Also, some process may be omitted depending on usage requirements or the like.

The above embodiment and modified examples may be combined freely. An appropriate combination should be selected according to usage requirements or the like.

The wiring board according to a first aspect of the present invention has the following: an inductor forming section having multiple first insulation layers, an inductor pattern formed on each of the multiple first insulation layers, and first via conductors formed in the first insulation layers and connecting to each other the inductor patterns positioned on different layers; a second insulation layer formed on the outermost first insulation layer and the inductor pattern of the inductor forming section; a land portion formed on the second insulation layer; a second via conductor formed in the second insulation layer and connecting the land portion and the outermost inductor pattern of the inductor forming section; a third insulation layer formed on the second insulation layer and on the land portion; a plain conductor formed on the third insulation layer; and a third via conductor formed in the third insulation layer and connecting the plain conductor and the land portion. In such a wiring board, the central axis passing through the center of the third via conductor is set to be positioned in the projected region of the second via conductor.

An inductor pattern positioned on the outermost layer of the inductor forming section is preferred to be separated 100 µm or more from the plain conductor.

The thickness of the land portion is preferred to be thinner than the thickness of the inductor pattern.

Except for the second via conductor, the third via conductor and the land portion, no other conductor is preferred to exist between the outermost inductor pattern of the inductor section and the plain conductor.

The first insulation layers, the second insulation layer, and the third insulation layer are each preferred to contain inorganic fiber reinforcing material.

The plain conductor is preferred to have mesh holes.

On the third insulation layer and on the plain conductor, a buildup layer is preferred to be formed by alternately laminating a fourth insulation layer, which does not contain inorganic fiber reinforcing material, and a conductive pattern.

The thickness of the inductor pattern is preferred to be greater than the thickness of the conductive pattern.

The inductor pattern is preferred to be made up of a metal foil on the first insulation layer, electroless plated film on the metal foil and electrolytic plated film on the electroless plated film.

A method for manufacturing a wiring board according to a second aspect of the present invention includes the following: forming multiple first insulation layers and forming an inductor pattern on each of the multiple first insulation layers; forming a first via conductor in the first insulation layer to connect to each other the inductor patterns positioned on different layers; forming a second insulation layer on the outermost first insulation layer and the inductor pattern of the inductor forming section; forming a land portion on the second insulation layer; in the second insulation layer, forming a second via conductor to connect the land portion and the outermost inductor pattern of the inductor forming section; forming a third insulation layer on the second insulation layer and the land portion; forming a plain conductor on the third insulation layer; and in the third insulation layer, forming a third via conductor to connect the plain conductor and the land portion. In such a manufacturing method, the central axis which passes through the center of the third via conductor is set to be positioned in the projected region of the second via conductor.

Desired inductor characteristics (inductance, Q factor) may not be achieved in an inductor, when either magnetic flux (magnetic lines of force) generated in the inductor is interfered with by plain conductors formed on both surfaces of a core substrate, or when eddy currents occur in the plain conductors, or the like. Such tendencies may be notable when insulation layers with conductive patterns become thinner and conductive patterns are fine pitched (fine lines) in a wiring board.

According to the present embodiment, it is easy to achieve desired inductor characteristics (inductance, Q factor) in a wiring board with an inductor.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a substrate comprising a plurality of first insulation layers, a plurality of second insulation layers formed on the outermost first insulation layers of the first insulation layers, respectively, a plurality of third insulation layers formed on the second insulation layers, respectively, and a plurality of plain conductors formed on the third insulation layers, respectively,
   wherein the substrate has an inductor forming portion in which a plurality of inductor patterns is formed on the plurality of first insulation layers, respectively, and a plurality of first via conductors formed in the first insulation layers, respectively, such that the first via conductors are connecting the inductor patterns through the first insulation layers, the substrate has a plurality of land structures formed on the second insulation layers, respectively, and a plurality of second via conductors formed in the second insulation layers, respectively, such that the plurality of second via conductors is connecting the land structures and the outermost inductor patterns of the inductor patterns, respectively, the substrate has a plurality of third via conductors formed in the third insulation layers, respectively, such that the plurality of third via conductors is connecting the plain conductors and the land structures, respectively, and each has a central axis passing through the center of each of the third via conductors inside a projected region of a respective one of the second via conductors and that the plurality of outermost inductor patterns of the inductor patterns is formed in the substrate such that the outermost inductor patterns are separated 100 μm or more from the plain conductors, respectively.

2. The wiring board according to claim 1, wherein each of the land structures has a thickness which is less than a thickness of each of the inductor patterns.

3. The wiring board according to claim 1, wherein the substrate has no other conductor between the outermost inductor patterns of the inductor patterns and the plain conductors except the second via conductors, the third via conductors and the land portions.

4. The wiring board according to claim 1, wherein each of the first insulation layers, second insulation layers and third insulation layers has an inorganic fiber reinforcing material.

5. The wiring board according to claim 1, wherein each of the plain conductors has a plurality of mesh holes.

6. The wiring board according to claim 1, further comprising a buildup layer comprising a conductive pattern formed on one of the third insulation layers and a respective one of the plain conductors and a fourth insulation layer laminated on the conductive pattern, wherein the fourth insulation layer does not contain an inorganic fiber reinforcing material.

7. The wiring board according to claim 6, wherein each of the inductor patterns has a thickness which is greater than a thickness of the conductive pattern.

8. The wiring board according to claim 1, wherein each of the inductor patterns comprises a metal foil formed on a respective layer of the first insulation layers, an electroless plated film on the metal foil, and an electrolytic plated film on the electroless plated film.

9. The wiring board according to claim 1, further comprising a buildup layer comprising a conductive pattern formed on one of the third insulation layers and a respective one of the plain conductors and a fourth insulation layer laminated on the conductive pattern.

10. The wiring board according to claim 9, wherein the inductor pattern has a thickness which is greater than a thickness of the conductive pattern.

11. The wiring board according to claim 1, wherein each of the land structures has a thickness which is less than a thickness of each of the inductor patterns, and each of the inductor patterns comprises a metal foil formed on a respective layer of the first insulation layers, an electroless plated film on the metal foil, and an electrolytic plated film on the electroless plated film.

12. The wiring board according to claim 1, further comprising a buildup layer comprising a conductive pattern formed on one of the third insulation layers and a respective one of the plain conductors and a fourth insulation layer laminated on the conductive pattern, wherein the fourth insulation layer does not contain an inorganic fiber reinforcing material, and each of the first insulation layers, second insulation layers and third insulation layers has an inorganic fiber reinforcing material.

13. The wiring board according to claim 12, wherein each of the inductor patterns has a thickness which is greater than a thickness of the conductive pattern.

14. The wiring board according to claim 1, further comprising a buildup layer comprising a conductive pattern formed on one of the third insulation layers and a respective one of the plain conductors and a fourth insulation layer laminated on the conductive pattern, wherein the fourth insulation layer does not contain an inorganic fiber reinforcing material, and the respective one of the plain conductors has a plurality of mesh holes.

15. The wiring board according to claim 1, further comprising:
   a buildup layer formed on the substrate and configured to mount a semiconductor electronic component such that the semiconductor electronic component is positioned directly over the inductor forming portion of the substrate.

16. The wiring board according to claim 1, further comprising:
   a buildup layer formed on the substrate and configured to mount a semiconductor electronic component such that the semiconductor electronic component is positioned directly over the inductor forming portion of the substrate,
   wherein the buildup layer comprises a conductive pattern formed on one of the third insulation layers and a respective one of the plain conductors and a fourth insulation layer laminated on the conductive pattern.

* * * * *